United States Patent
Deeds et al.

(10) Patent No.: US 7,808,158 B1
(45) Date of Patent: Oct. 5, 2010

(54) FLOW DRIVEN PIEZOELECTRIC ENERGY HARVESTING DEVICE

(75) Inventors: Michael Deeds, Port Tobacco, MD (US); Veronica Valeriano, Alexandria, VA (US); Gerald Laib, Olney, MD (US); John Hendershot, Dunkirk, MD (US); David Olson, Chesapeake Beach, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/973,993

(22) Filed: Sep. 27, 2007

(51) Int. Cl.
*H02N 2/18* (2006.01)

(52) U.S. Cl. .................... 310/339; 310/113; 310/75 C; 310/102 R

(58) Field of Classification Search .................. 102/201, 102/202, 225, 320, 211; 310/331, 334, 113, 310/154.02
See application file for complete search history.

(56) References Cited

U.S. PATENT DOCUMENTS

| 3,699,860 | A | * | 10/1972 | Winkler | 396/191 |
| 3,908,551 | A | * | 9/1975 | Dahl | 102/208 |
| 4,387,318 | A | * | 6/1983 | Kolm et al. | 310/330 |
| 4,536,674 | A | * | 8/1985 | Schmidt | 310/330 |
| 4,854,177 | A | | 8/1989 | Phipps et al. | |
| 5,223,763 | A | | 6/1993 | Chang | |
| 5,341,062 | A | | 8/1994 | Cero, Jr. et al. | |
| 5,861,703 | A | | 1/1999 | Losinski | |
| 5,942,714 | A | * | 8/1999 | Oberlin et al. | 89/6.5 |
| 6,011,346 | A | | 1/2000 | Buchanan et al. | |
| 6,198,205 | B1 | | 3/2001 | Oberlin et al. | |
| 6,424,079 | B1 | | 7/2002 | Carroll | |
| 6,438,957 | B1 | * | 8/2002 | Goldman | 60/641.8 |
| 6,522,048 | B1 | * | 2/2003 | Burns et al. | 310/316.01 |
| 6,768,214 | B2 | | 7/2004 | Schultz et al. | |
| 6,964,231 | B1 | * | 11/2005 | Robinson et al. | 102/235 |
| 2006/0061107 | A1 | * | 3/2006 | Cadaret | 290/44 |
| 2007/0176428 | A1 | * | 8/2007 | Nagao | 290/44 |
| 2010/0052324 | A1 | * | 3/2010 | Priya | 290/50 |

\* cited by examiner

*Primary Examiner*—Thomas M. Dougherty
*Assistant Examiner*—Bryan P Gordon
(74) *Attorney, Agent, or Firm*—Frederic J. Zimmerman

(57) ABSTRACT

An electrical generator includes a fluid-flow driven impeller including at least one impact arm; and at least one cantilevered beam disposed such that the impact arm strikes the cantilevered beam as the impeller rotates. The cantilevered beam at least partially includes a piezoelectric film.

7 Claims, 1 Drawing Sheet

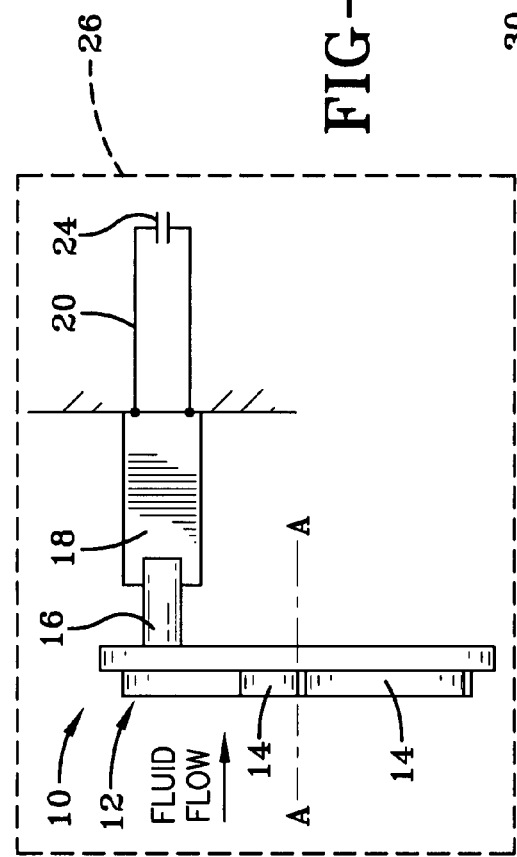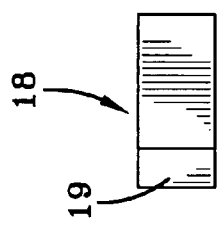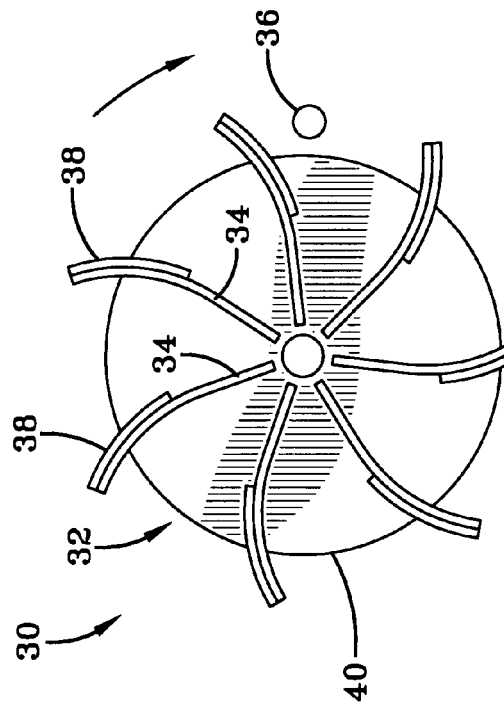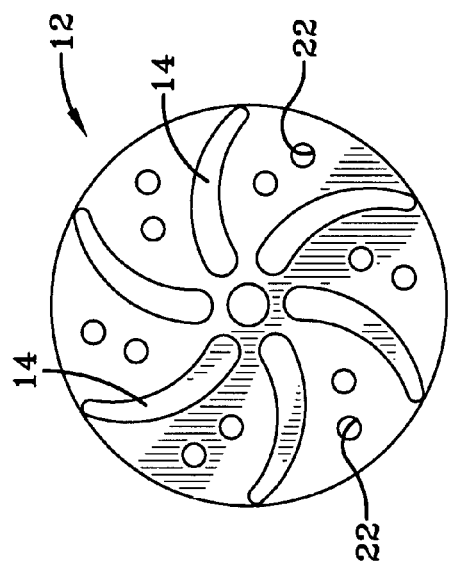

FLOW DRIVEN PIEZOELECTRIC ENERGY HARVESTING DEVICE

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

The invention relates in general to electric power generators and in particular to piezoelectric power generators.

Many weapons require an electrical pulse to initiate their explosive fire train. The electrical pulse is typically provided by electrical energy stored in the weapon's fuze. Batteries are one method to store electrical energy. Batteries, however, are heavy, expensive and have a limited shelf life. Conventional technologies disclose the use of piezoelectric films that are strained during setback acceleration to generate electricity. Because of the relatively short duration of setback acceleration, the amount of energy that can be generated during setback is limited. In addition, some weapons do not experience setback acceleration. Thus, there is a need for an electric power generator that is small and lightweight enough to fit in a weapon fuze, yet able to generate sufficient energy to initiate an explosive fire train.

SUMMARY OF THE INVENTION

It is an object of the invention to provide a fluid driven electric power source, in particular for a fuze for a weapon.

One aspect of the invention is an apparatus including a fluid-flow driven impeller including at least one impact arm; and at least one cantilevered beam disposed such that the impact arm strikes the cantilevered beam as the impeller rotates, the cantilevered beam at least partially including a piezoelectric film.

The apparatus may be a fuze for a weapon.

Another aspect of the invention is a method including rotating an impeller having at least one impact arm; and striking at least one cantilevered beam with the impact arm as the impeller rotates, the cantilevered beam at least partially comprising a piezoelectric film.

A further aspect of the invention is an apparatus including a fluid-flow driven impeller having at least one flexible vane at least partially comprising a piezoelectric film. The apparatus may further comprise at least one rigid impact arm disposed such that the at least one flexible vane strikes the rigid impact arm as the impeller rotates.

Yet another aspect of the invention is a method including rotating an impeller having at least one flexible vane, the at least one flexible vane at least partially comprising a piezoelectric film. The method may further comprise striking at least one rigid impact arm with the flexible vane as the impeller rotates.

The invention will be better understood, and further objects, features, and advantages thereof will become more apparent from the following description of the preferred embodiments, taken in conjunction with the accompanying drawings.

BRIEF DESCRIPTION OF THE DRAWINGS

In the drawings, which are not necessarily to scale, like or corresponding parts are denoted by like or corresponding reference numerals.

FIG. 1 is a schematic of an embodiment of the invention.
FIG. 1A is a schematic of a beam.
FIG. 2 is a front view of an impeller.
FIG. 3 is a schematic of another embodiment of the invention.

DETAILED DESCRIPTION OF EXEMPLARY EMBODIMENTS OF THE INVENTION

The invention includes an apparatus and method for generating electricity from fluid flow. The fluid may be a gas or liquid. One application for the invention is an energy supply for a weapon. When the weapon is airborne, the fluid flow that powers the apparatus is the air flow around the weapon. The electricity that is generated may be used as it is generated or stored for later use. In a weapon, the electricity is generally used to initiate an explosive fire train.

FIG. 1 shows one embodiment of an electricity generating apparatus 10 in accordance with the invention. Apparatus 10 includes a fluid-flow driven impeller 12 having a plurality of vanes 14. The impeller 12 may be axial or radial flow and rotates about axis A-A. Impeller 12 includes at least one impact arm 16. Disposed adjacent impeller 12 is at least one cantilevered beam 18. Beam 18 is disposed such that the impact arm 16 strikes the cantilevered beam 18 as the impeller 12 rotates. The cantilevered beam 18 includes wholly or partially a piezoelectric film. The piezoelectric film that includes all or part of the beam 18 is strained when the beam 18 is struck by the impact arm 16.

The term "piezoelectric film," for the purposes of this patent, includes all forms of piezoelectric material, whether in the form of a film or in some other form. Although films are particularly useful for the invention, other forms of piezoelectric material may be used.

In one embodiment, the entire beam 18 is made of a piezoelectric film. In other embodiments, for example, FIG. 1A, the portion 19 of the beam 18 that contacts the impact arm 16 may include a material that is more durable than a piezoelectric film so that the life of the apparatus is extended. It is not necessary that the impact arm 16 actually contact the piezoelectric film, but only that the piezoelectric film is strained when the impact arm 16 strikes the beam 18. Although FIG. 1 shows a single impact arm 16 and a single beam 18, multiple arms 18 and beams 18 may be used.

FIG. 2 is a front view of the impeller 12 showing a plurality of vanes 14. In FIG. 2, the fluid flow is normal to the plane of the figure. Holes 22 may be formed in the impeller 12 to reduce weight and/or to allow release of the micromachined device from the substrate. However, the holes 22 are optional. The impact arm 16 is hidden behind the impeller 12 in FIG. 2. The impeller 12 and impact arm 16 may be made of, for example, metals or plastics. Piezoelectric films that comprise the beam 18 are known and available.

Referring again to FIG. 1, as impeller 12 rotates, impact arm 16 strikes beam 18. The beam 18 is cantilevered and flexes when struck by the impact arm 16, thereby generating electricity. An electrical storage circuit 20 including, for example, a capacitor 24, is connected to the beam 18. The electricity may be used immediately or, more generally, stored in the storage circuit 20. Storage circuit 20 may be connected to a fuze circuit (not shown) of a weapon. In one embodiment, the apparatus 10 is part of a fuze 26 of a weapon. When the weapon is airborne, the impeller 12 may be deployed such that the ambient air causes the impeller to rotate.

FIG. 3 is a side view of another embodiment of an electricity generating apparatus 30 in accordance with the invention.

Apparatus 30 comprises a fluid-flow driven impeller 32 having at least one flexible vane 34. Flexible vane 34 includes wholly or partially a piezoelectric film. In an exemplary embodiment, there are a plurality of flexible vanes 34. In an exemplary embodiment, tip portion 38 may be a piezoelectric film. In other exemplary embodiments, tip portion 38 may be a material that is more durable than a piezoelectric film so that the life of the apparatus is extended. Flexible vane 34 is at least partially detached from hub 40 so that it may flex.

At least one rigid impact arm 36 is disposed such that the flexible vanes 34 strike the rigid impact arm 36 as the impeller 32 rotates. It is not necessary that the impact arm 36 actually contact the piezoelectric film portion of flexible vane 34, although it may. It is required that the piezoelectric film portion of the flexible vane 34 is strained when the impact arm 16 strikes the flexible vane 34. Multiple impact arms 36 may be used. Flexible vanes 34 are connected to a storage circuit (not shown) that may be mounted on the impeller 32 or separate from the impeller. If the circuit is separate from the impeller, then rotating contacts (not shown) may be used to transfer the electricity from the impeller 32 to the storage circuit.

Another embodiment of the invention includes the impeller 32 with at least one flexible vane 34 comprising wholly or partially a piezoelectric film. In an exemplary embodiment, there are a plurality of flexible vanes 34 including wholly or partially a piezoelectric film. In this embodiment, there is no impact arm. Rather, the turbulence of the air flow causes the flexible vanes 34 to deform, thereby generating electricity.

While the invention has been described with reference to certain preferred embodiments, numerous changes, alterations and modifications to the described embodiments are possible without departing from the spirit and scope of the invention as defined in the appended claims, and equivalents thereof.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. An apparatus, comprising:
   an impeller comprising at least one impact arm; and
   at least one cantilevered beam being disposed, such that said at least one impact arm mechanically strains the cantilevered beam as the impeller rotates, said at least one cantilevered beam at least partially comprises a piezoelectric film,
   wherein the impeller is a fluid-flow driven impeller.

2. The apparatus of claim 1, further comprising a storage circuit connected to said at least one cantilevered beam.

3. The apparatus of claim 2, wherein the apparatus is a fuze for a weapon.

4. A method, comprising:
   rotating an impeller comprising at least one impact arm; and
   straining at least one cantilevered beam with said at least one impact arm as the impeller rotates,
      wherein said at least one cantilevered beam at least partially comprises a piezoelectric film, and
      wherein said straining is mechanical straining.

5. The method of claim 4, wherein said rotating includes rotating the impeller using fluid flow.

6. The method of claim 5, wherein the fluid flow is air.

7. The method of claim 4, further comprising storing electricity generated as said at least one impact arm strikes said at least one cantilevered beam.

* * * * *